(12) United States Patent
Chyan et al.

(10) Patent No.: US 6,555,871 B1
(45) Date of Patent: Apr. 29, 2003

(54) FLASH MEMORY DEVICE HAVING A BIPOLAR TRANSISTOR FORMED INTEGRAL THERETO AND A METHOD OF MANUFACTURE THEREFOR

(75) Inventors: Yih-Feng Chyan, Orlando, FL (US); Chung Wai Leung, Orlando, FL (US); Ranbir Singh, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/488,108

(22) Filed: Jan. 20, 2000

(51) Int. Cl.[7] .................. H01L 29/792; H01L 29/76; H01L 29/94; H01L 31/062; H01L 31/113
(52) U.S. Cl. .................. 257/326; 257/318; 257/370; 257/371
(58) Field of Search .................. 257/318, 326, 257/370, 371

(56) References Cited

U.S. PATENT DOCUMENTS

| | | | | |
|---|---|---|---|---|
| 5,350,938 A | * | 9/1994 | Matsukawa et al. | 257/316 |
| 5,471,419 A | * | 11/1995 | Sankaranarayanan et al. | 257/133 |
| 5,783,457 A | * | 7/1998 | Hsu | 438/302 |
| 6,111,286 A | * | 8/2000 | Chi et al. | 257/215 |
| 6,144,077 A | | 11/2000 | Maki | |
| 6,258,668 B1 | * | 8/2001 | Lee et al. | 438/262 |

FOREIGN PATENT DOCUMENTS

| | | |
|---|---|---|
| EP | 0 463 623 A2 | 1/1992 |
| EP | 0 547 676 A1 | 6/1993 |

OTHER PUBLICATIONS

Lin, F. R–L. et al., "ANovel Hot Carrier Mechanism: Band–to–Band Tunneling Hole Induced Bipolar Hot Electron (BBHBHE)", Dec., 1999, IEDM 99, pp. 741–744.*
Ohnakado, T. et al., "1.5 V Operation Sector–Erasable Flash Memory with Bipolar Transistor Selected (BITS) P–channel Cells", Jun. 1998, Symposium on Vlsi Technology, 1998 Digest of Technical Papers, pp. 14–15.*

* cited by examiner

*Primary Examiner*—Wael Fahmy
*Assistant Examiner*—Howard Weiss

(57) ABSTRACT

The present invention provides a bipolar transistor for use in increasing a speed of a flash memory cell having a source region and a drain region and first and second complementary tubs. In one embodiment, a base for the bipolar transistor is located in the first complementary tub. The first complementary tub functions as a collector for the bipolar transistor. The bipolar transistor base also uniquely functions as the source region. The bipolar transistor's emitter is also located in the first complementary tub and proximate the base. For example, the emitter may be located adjacent the base or actually located in the base. In an additional embodiment, the opposing bases and emitters are located on opposing sides of and proximate to the flash memory cell.

20 Claims, 9 Drawing Sheets

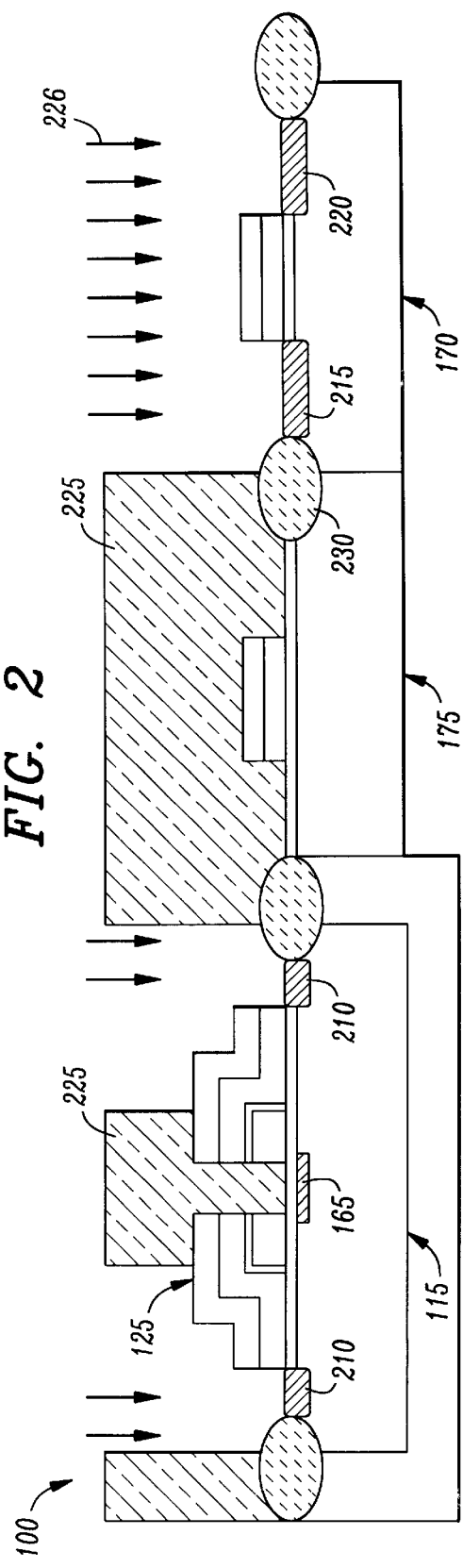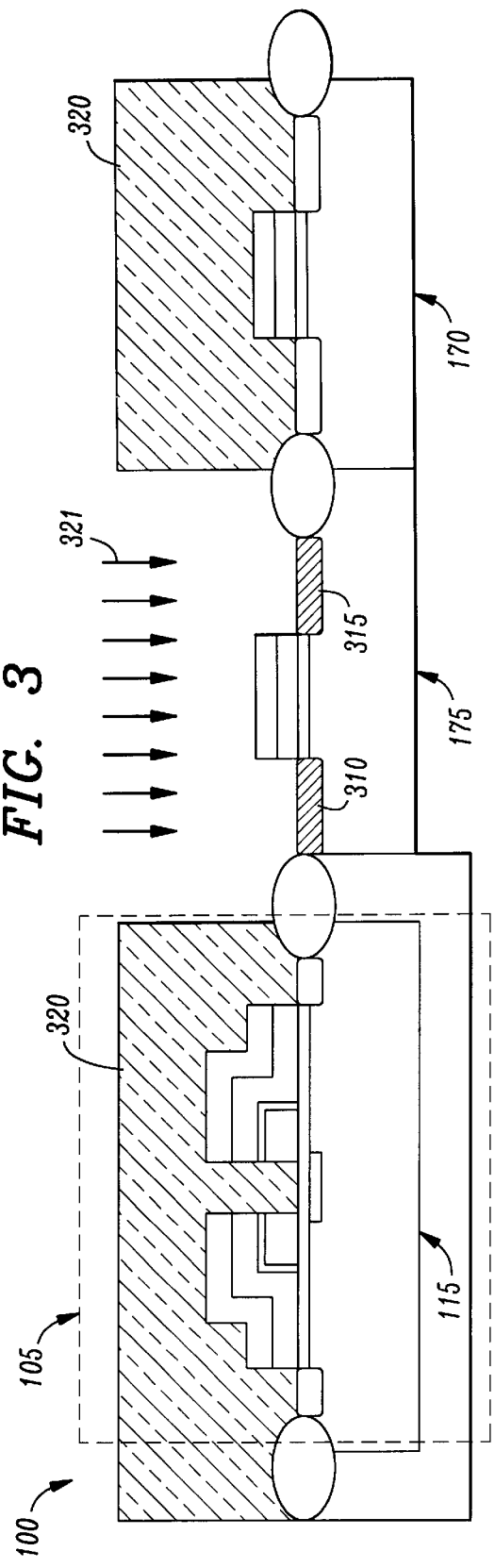

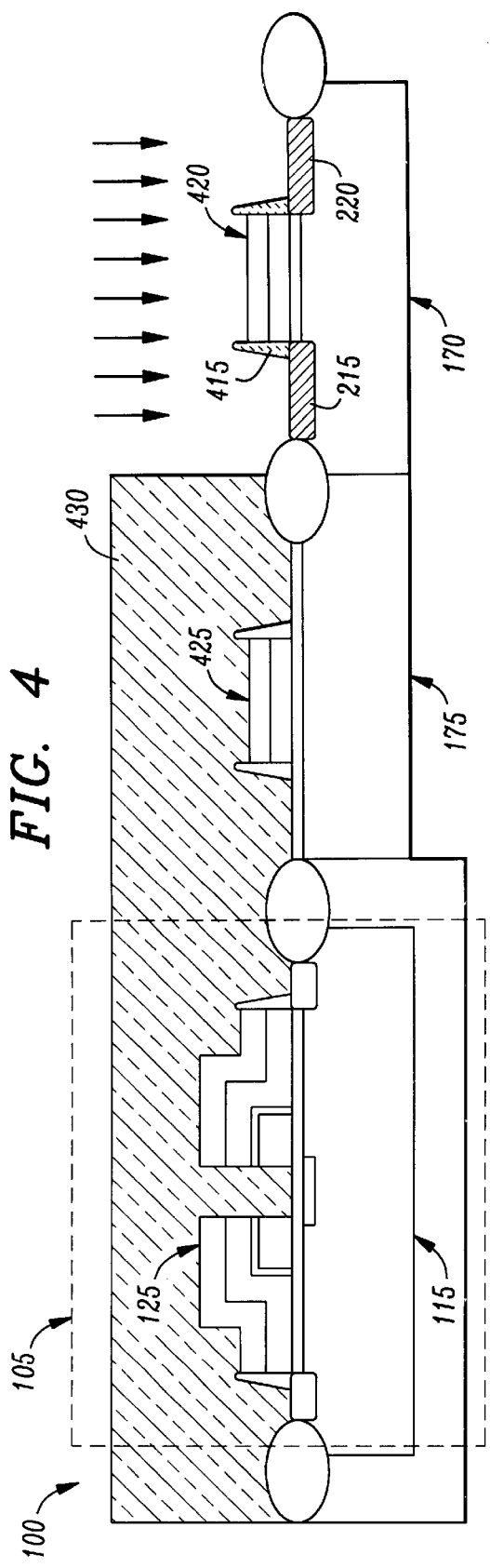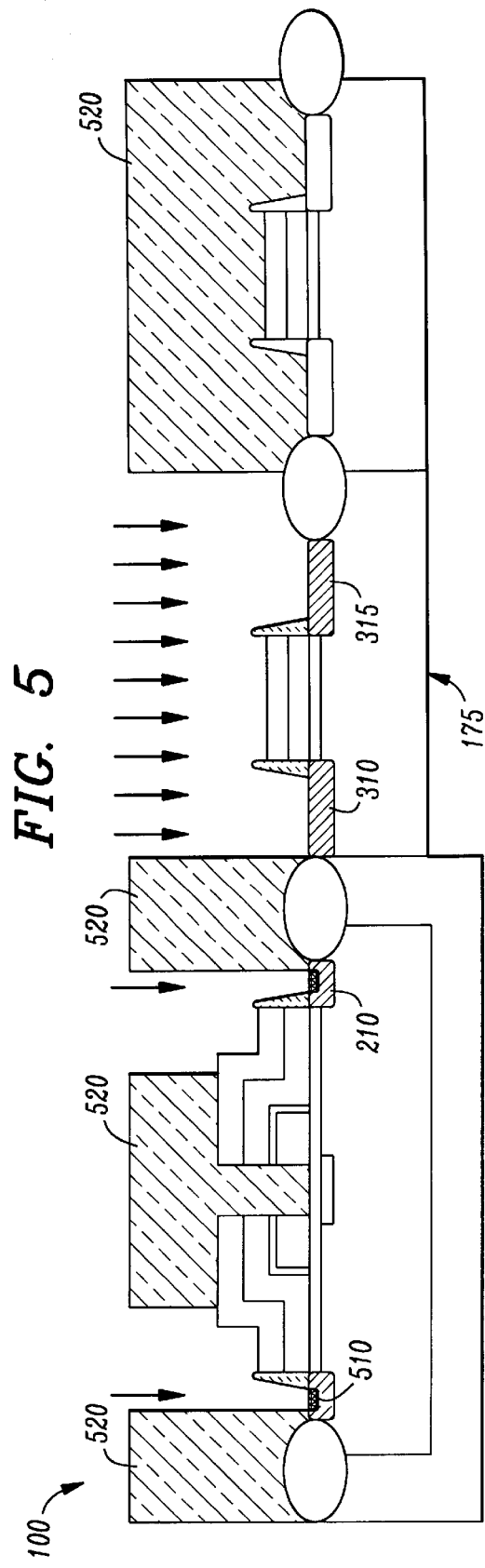

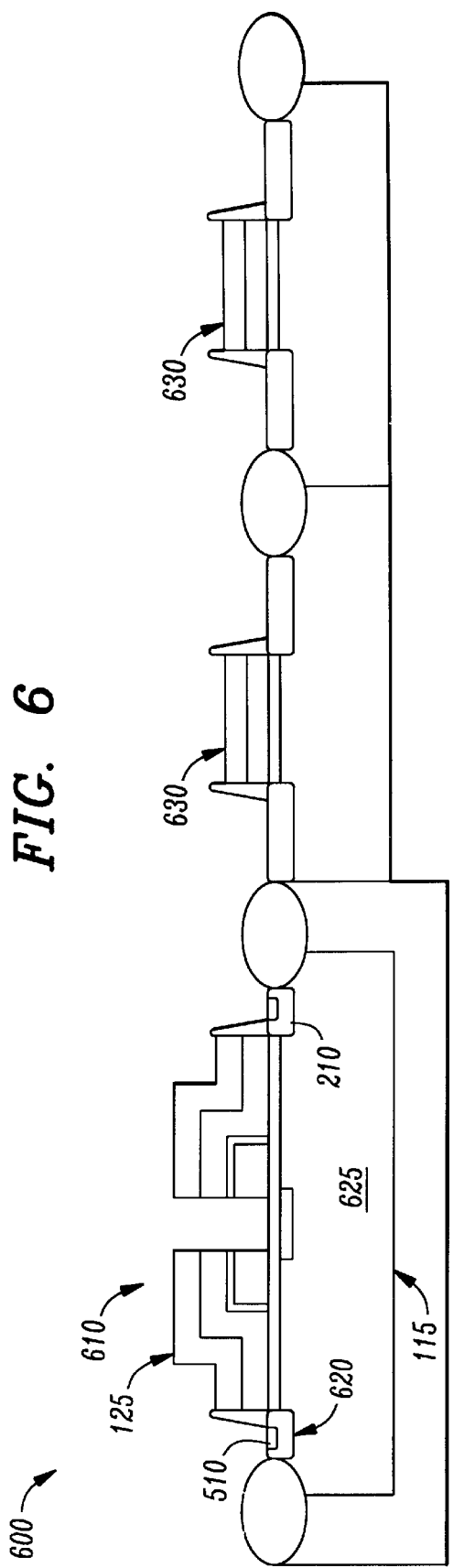

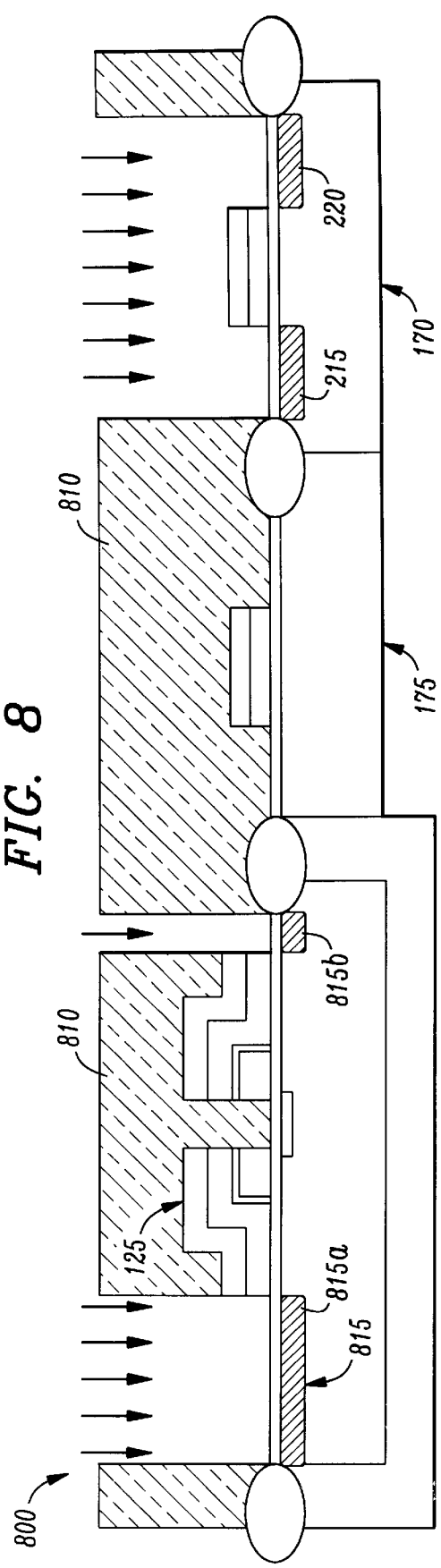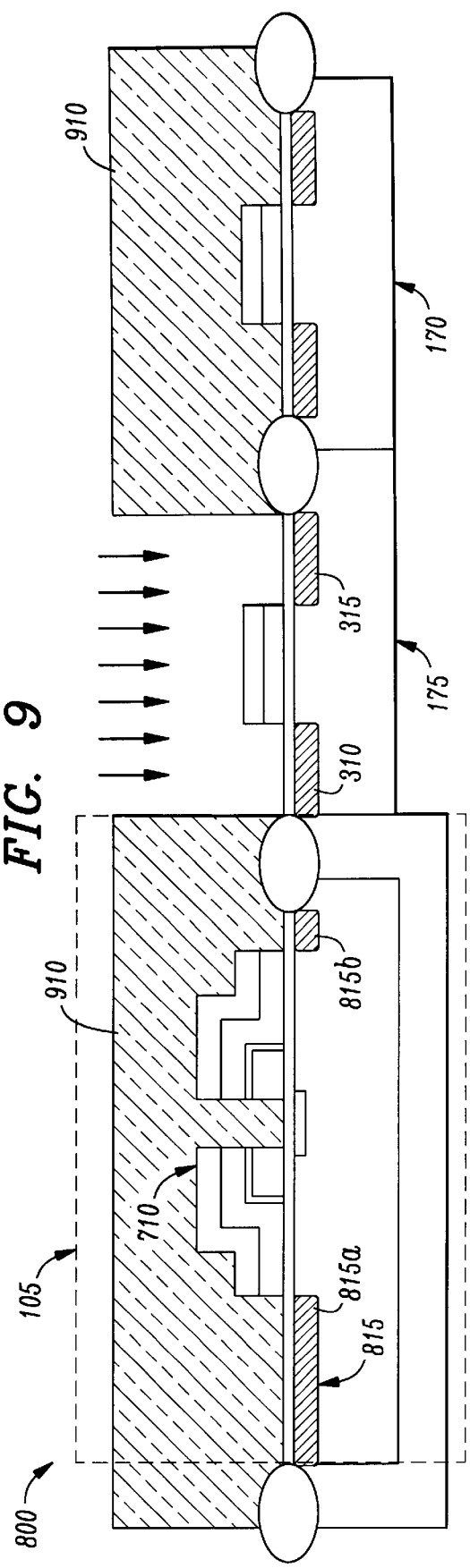

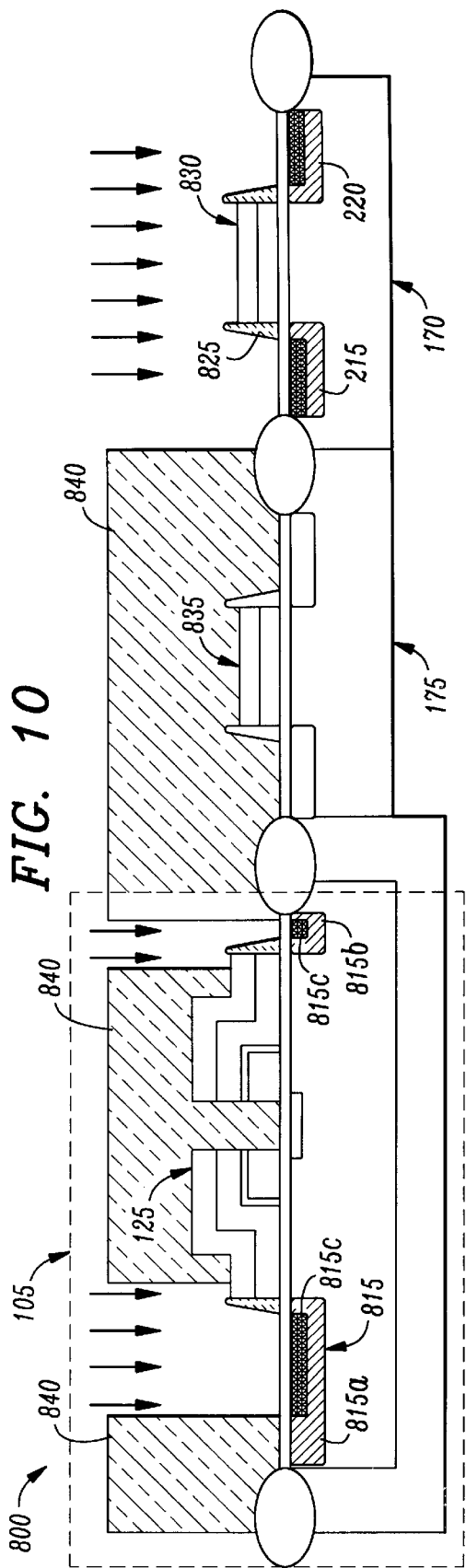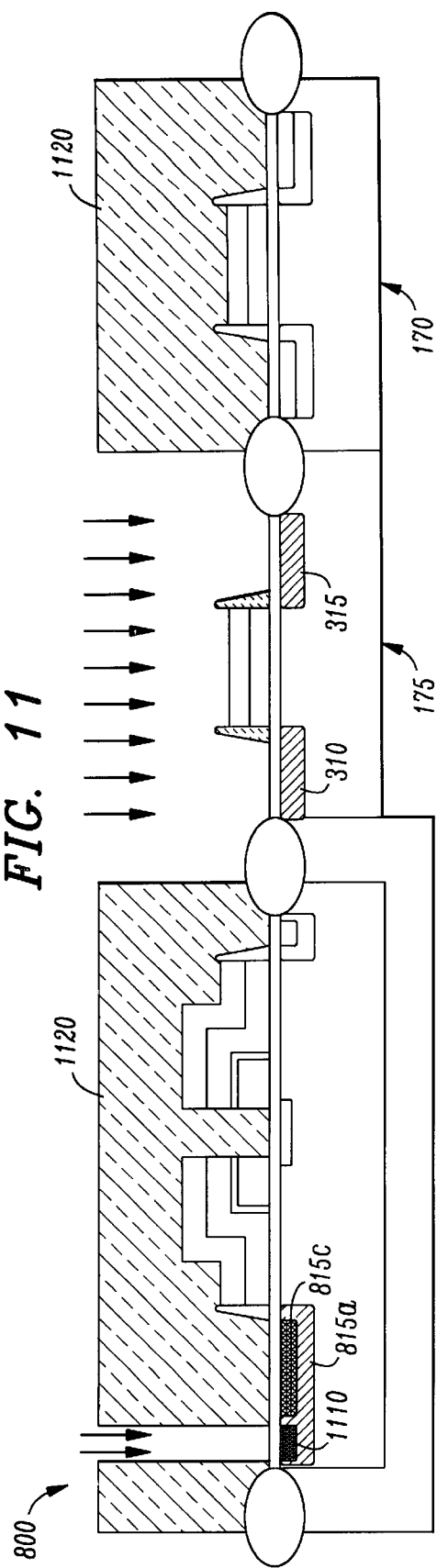

FLASH MEMORY DEVICE HAVING A BIPOLAR TRANSISTOR FORMED INTEGRAL THERETO AND A METHOD OF MANUFACTURE THEREFOR

TECHNICAL FIELD OF THE INVENTION

The present invention is directed, in general, to a semiconductor device and a method of manufacturing that device and, more specifically, to a flash memory device having a bipolar transistor associated therewith and a method of manufacture therefore.

BACKGROUND OF THE INVENTION

Memory devices, such as flash memory devices, have been employed in numerous electronic technologies, and thus, have accounted for a large number of the integrated circuits (IC's) produced. Simplicity in design and relative ease in taking advantage of new technological advances have made these memory devices a natural vehicle for technology development. Over the last decade, the operating speeds and packing densities of IC's have increased substantially while the device size has been dramatically reduced. With the dramatic decrease in device size, it is highly desirable to lower the input voltage of those IC's. This was a result of reduced breakdown voltage and increased power dissipation problems associated with the increased packing density and decreased device size. The combination of increased packing density, device size reduction, and more specifically, reduced operating voltage, have affected the speed at which the memory devices function, which has been particularly acute in flash memory device technologies.

As various technologies have advanced, the need for memory devices that function at faster speeds has grown. Thus, a highly desirable requirement of a flash memory device is that it can read quickly (i.e., have a fast read time). Fast reading speeds require that the flash memory devices have a high charging current that can easily and quickly charge the load capacitance. However, decreasing the device voltage, as described above, makes the available charging current decrease (assuming the current depends on a fixed value of resistance), thus, increasing the read time. The charging current may be maintained, or even increased, even though the device voltage is decreased, but this requires decreasing the resistance within the flash memory device. This situation results in increased power to the chip, which in turn brings about undesirable power dissipation.

In an attempt to provide a faster flash memory device, the IC industry has developed various types of flash memory devices of varying structure and design. Often, these flash memory devices require additional fabrication steps that add to the overall cost of the semiconductor device into which the flash memory is incorporated. Moreover, the resulting flash memory may still lack the desired reading speed. While these attempts may have somewhat increased the reading speeds of flash memory devices, there remains a gap in the reading speed memory devices and the amount of data that needs to be downloaded, and the expectations of the end user. One technology where this problem often arises is digital cameras, where a graphical image may often consist of several megabytes of data. Slower read times result in a slower download of the transmitted data. Given the overall general increase in the speed of today's ICs, the end user expects faster download times as well. Furthermore, the sheer amount of data that often needs to be downloaded is also constantly increasing.

Accordingly, what is needed in the art is a flash memory device capable of operating at substantially lower read times and that may be manufactured inexpensively with as few a number of fabrication steps as possible. The present invention addresses these needs.

SUMMARY OF THE INVENTION

To address the above-discussed deficiencies of the prior art, the present invention provides a bipolar transistor for use in increasing a speed of a flash memory cell having a source region, a drain region, and first and second complementary tubs. In a preferred embodiment, a base for the bipolar transistor is located in the first complementary tub of the flash memory cell, the first complementary tub also functioning as a collector for the bipolar transistor. The bipolar transistor base also uniquely functions as the source region of the flash memory cell. The bipolar transistor's emitter is also located in the first complementary tub, and proximate the base. For example, the emitter may be located adjacent the base or be actually located in the base region itself. In an additional embodiment, opposing bases and emitters are located on opposing sides of and proximate to the flash memory cell.

Thus, in a broad sense, the present invention provides a flash memory device having both high reading speeds and low power dissipation. The flash memory device includes a bipolar transistor that allows for a smaller resistance to be placed in the flash memory device, which increases the reading speed. When the transistor is located in a closed position, it allows the charging current to charge the capacitance at a fast rate. However, when the transistor is located in the open position, no charging current is present, thus no power dissipation occurs except for a small amount of leakage.

BRIEF DESCRIPTION OF THE DRAWINGS

For a more complete understanding of the present invention, reference is now made to the following descriptions taken in conjunction with the accompanying drawings, in which:

FIG. 2 illustrates a semiconductor device in which a bipolar transistor base is being formed in a complementary tub;

FIG. 3 illustrates the process of forming a source and a drain within the MOS tub;

FIG. 4 illustrates oxide spacers being conventionally formed on the sides of the flash memory gate and the MOS transistor gates;

FIG. 5 illustrates a partial sectional view of a semiconductor device in which a bipolar transistor emitter is formed within the bipolar transistor base, and simultaneously with a second source drain implant of the source and drain of the MOS tub;

FIG. 6 illustrates a partial view of the completed flash memory device;

FIG. 8 illustrates a partial sectional view of an alternative semiconductor device at an intermediate step of fabrication;

FIG. 9 illustrates the process of forming the source and the drain within the MOS tub of the semiconductor device illustrated in FIG. 8;

FIG. 10 illustrates an n-type source drain (N S/D) implantation of the base region and the MOS tub of the semiconductor device illustrated in FIG. 9;

FIG. 11 illustrates a partial sectional view in which a bipolar transistor emitter is formed within the lightly doped wide portion and simultaneously with a second source drain implant of the source and drain of the MOS tub;

DETAILED DESCRIPTION

As explained below, the present invention provides a bipolar transistor that can be easily and economically integrated into a flash memory device without additional masks or cost. Given this unique structure, the cell memory drain current can, therefore, become the base current of the bipolar transistor. This allows the memory cell drain to be amplified several times, for example up to 10 times, to flow into the bipolar transistor emitter. The degree of amplification, however, depends on the current gain of the bipolar transistor. Due to the substantial amplification in the memory drain, the flash memory device has a much faster read time than conventionally formed flash memory cells. Thus, high current gain bipolar transistors may be obtained with no additional masks or by adding only one mask for NLDD or P S/D, resulting in a substantially faster read time for the flash memory device.

Figure 1:
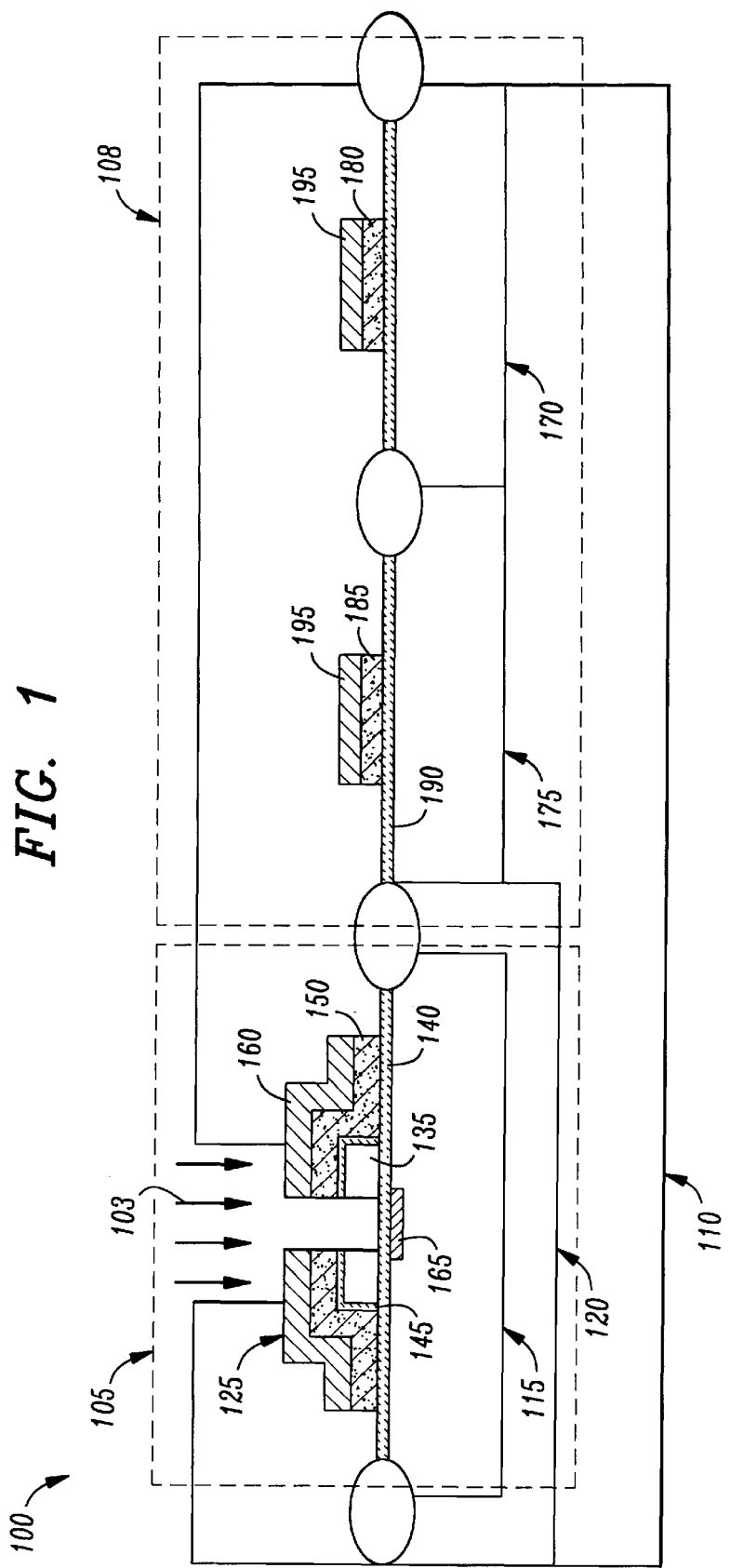
FIG. 1 illustrates a partial sectional view of a semiconductor device at an intermediate phase of production.

Referring initially to FIG. 1, there is illustrated a partial sectional view of a semiconductor device 100 at an intermediate phase of production. In a preferred embodiment, the semiconductor device 100 includes a memory cell region 105, indicated by dashed lines, and a metal oxide semiconductor (MOS) region 108, which is also indicated by dashed lines. Regions 105 and 108 are formed on a conventionally doped semiconductor wafer substrate 110. The memory cell region 105 includes a first complementary tub 115 and a second complementary tub 120, both of which are formed within the doped substrate 110. The second complementary tub 120 preferably extends into the adjoining MOS region 108. The complementary tubs 115 and 120 form a triple well structure (not shown) within the memory cell region 105.

The memory cell region 105 further includes a conventionally formed flash memory gate 125. While, the design of the flash memory gate 125 may vary from one embodiment to another, a preferred embodiment comprises a floating gate 135 that is deposited on a gate oxide 140. In this particular design, the floating gate 135 has an oxide layer 145 deposited on it. Located on the oxide layer 145 is a control gate 150, preferably having a metal silicide layer 160, such as a tungsten silicide (WSi), deposited thereon. In preferred embodiments, the flash memory gate 125 is a split gate, which is illustrated in FIG. 1. The flash memory gate 125 preferably has a doped drain region 165, which may be implanted with arsenic (As) and boron difluoride ($BF_2$) 103. The drain region 165 contacts opposing sides of the split gate flash memory gate 125.

The MOS region 108 preferably comprises conventionally formed complementary MOS tubs 170 and 175, such as complementary PMOS and NMOS tubs, which form a complementary MOS (CMOS) device. However, other embodiments may possibly include only PMOS or NMOS devices. The first complementary tub 115 and the MOS tub 170 may be doped with the same type of dopant, such as a p-type dopant or an n-type dopant, while the second complementary tub 120 and the MOS tub 175 may be doped with a dopant opposite to that of the first complementary tub 115 and the MOS tub 170. In the embodiment illustrated in FIG. 1, the first complementary tub 115 and the MOS tub 170 are conventionally doped with a p-type dopant, while the second complementary tub 120 and the MOS tub 175 are conventionally doped with an n-type dopant. However, one who is skilled in the art understands that these tubs may be doped opposite to that just set forth above, if the design of the device requires so. The first complementary tub 115 not only forms the tub region for the flash memory gate 125, but it also uniquely serves as a collector region of a bipolar transistor as described below.

The MOS region 108 further includes conventional transistor polysilicon gates 180, 185 formed on a transistor gate oxide 190. In a preferred embodiment, a metal silicide layer 195, such as WSi is formed over the polysilicon gates 180,185.

It should be understood that the above-described device and its various embodiments may be formed by conventional processes, and it is well known how to integrate a flash memory cell into a MOS-based integrated circuit. As such, those processes have not been discussed in full detail.

Turning now to FIG. 2, following the formation of the semiconductor device 100 illustrated in FIG. 1, a bipolar transistor base 210 is formed in the first complementary tub 115 and a source 215 and a drain 220 are formed in the MOS tub 170. As illustrated in FIG. 2, a photoresist layer 225 is conventionally deposited and patterned over the region above the MOS tub 175 and the area over the drain region 165. The semiconductor device 100 is then subjected to a doping process. The dopant 226 used is opposite in type to the dopant used to form the tub into which the dopant is diffused. For example, if the tub is doped with a p-type dopant, the dopant used to form the bipolar transistor base 210 and the source and drain 215, 220 will be an n-type dopant and vice versa.

In a preferred embodiment, the bipolar transistor base 210 is formed during the formation of the n-type lightly doped drain (NLDD) implanting step that forms the source 215 and the drain 220 of the MOS tub 170. In the illustrated embodiment, the bipolar transistor base 210 and the source and drain 215, 220 are implanted with an n-type dopant 226. Preferably, the bipolar transistor base 210 is doped to a concentration level ranging from about $5 \times 10^{13}$ atoms/$cm^3$ to about $8 \times 10^{14}$ atoms/$cm^3$. In the preferred illustrated embodiment, the bipolar transistor base 210 can also serve as the drain region of the flash memory gate 125. As illustrated, the bipolar transistor base 210 and source and drain 215,220 are simultaneously formed, thereby decreasing the number of processing steps required to complete the semiconductor device 100. However, in one embodiment, the formation of the bipolar transistor base 210 and the source and drain 215,220 may be accomplished with separate masking and implanting steps. In such embodiments, the region over the bipolar transistor base 210 is isolated and then implanted, while the region over the source and drain 215,220 is protected by photoresist. Then, the region over the source and drain 215,220 is implanted while the bipolar transistor base 210 is protected by a photoresist. The sequence of these steps, may, of course, be reversed. When the masking steps are separated, a higher quality bipolar base can be achieved when design specifications require.

In those embodiments where the flash memory gate 125 is a split gate, the bipolar transistor base 210 is preferably formed on opposing sides of the flash memory gate 125. Furthermore, the bipolar transistor base 210 and the source and drain 215, 220 may be isolated by conventionally formed field oxide regions 230.

FIG. 3 shows the process of forming a source 310 and a drain 315 within the MOS tub 175. To accomplish this, photoresist 320 is conventionally deposited and patterned to leave the area over the MOS tub 175 exposed, while the memory cell region 105 and the MOS tub 170 remain protected by the photoresist 320. The semiconductor device 100 is then preferably subjected to a conventional p-type lightly doping drain implant (PLDD) 321, thus forming the source and drain 310, 315 within the MOS tub 175. The photoresist 320 is then removed in preparation for the next fabrication step.

Turning now to FIG. 4, after removal of the photoresist, oxide spacers 415 are conventionally formed on the sides of the flash memory gate 125 and the MOS transistor gates 420,425. Another photoresist 430 is deposited and patterned to expose the area only over the MOS tub 170, while leaving the memory cell region 105 and the MOS tub 175 protected by the photoresist 430. An n-type source drain (N S/D) implantation of the MOS tub 170 is then conducted such that only the MOS tub 170, and more specifically, the source and drain 215,220, encounter the N S/D implantation.

Turning now to FIG. 5, there is illustrated a partial sectional view in which a bipolar transistor emitter 510 is formed within the bipolar transistor base 210 and simultaneously with a second source drain implant of the source and drain 310, 315 of the MOS tub 175. In the illustrated embodiment, a photoresist 520 is deposited and patterned to leave the regions over the bipolar transistor base 210 and the MOS tub 175 exposed to a doping process. These exposed areas are then subjected to a p-type source drain implant (P S/D), which simultaneously forms the bipolar transistor emitter 510 and further dopes the source and drain 310, 315. However, if the semiconductor device's 100 design requires that the bipolar transistor base 210 comprise a p-type dopant, the bipolar transistor emitter 510 should then comprise an n-type dopant. As shown in this particular embodiment, the bipolar transistor emitter 510 is formed within the bipolar transistor base 210.

Illustrated in FIG. 6 is a partial view of a completed semiconductor device 600. The semiconductor device 600 includes a flash memory device 610, which has a bipolar transistor 620 formed on either side of the flash memory gate 125. The bipolar transistor base 210 also functions as the source of the flash memory device 610, and the first complementary tub 115 uniquely serves as a collector 625 for the bipolar transistor 620. Likewise, the combinations of the bipolar transistor base 210 and bipolar transistor emitter 510, may be located on opposing sides and proximate to the flash memory gate 125 as illustrated. On either side of the flash memory device 610 are MOS transistors, which in a preferred embodiment, are CMOS transistors 630.

Figure 7:
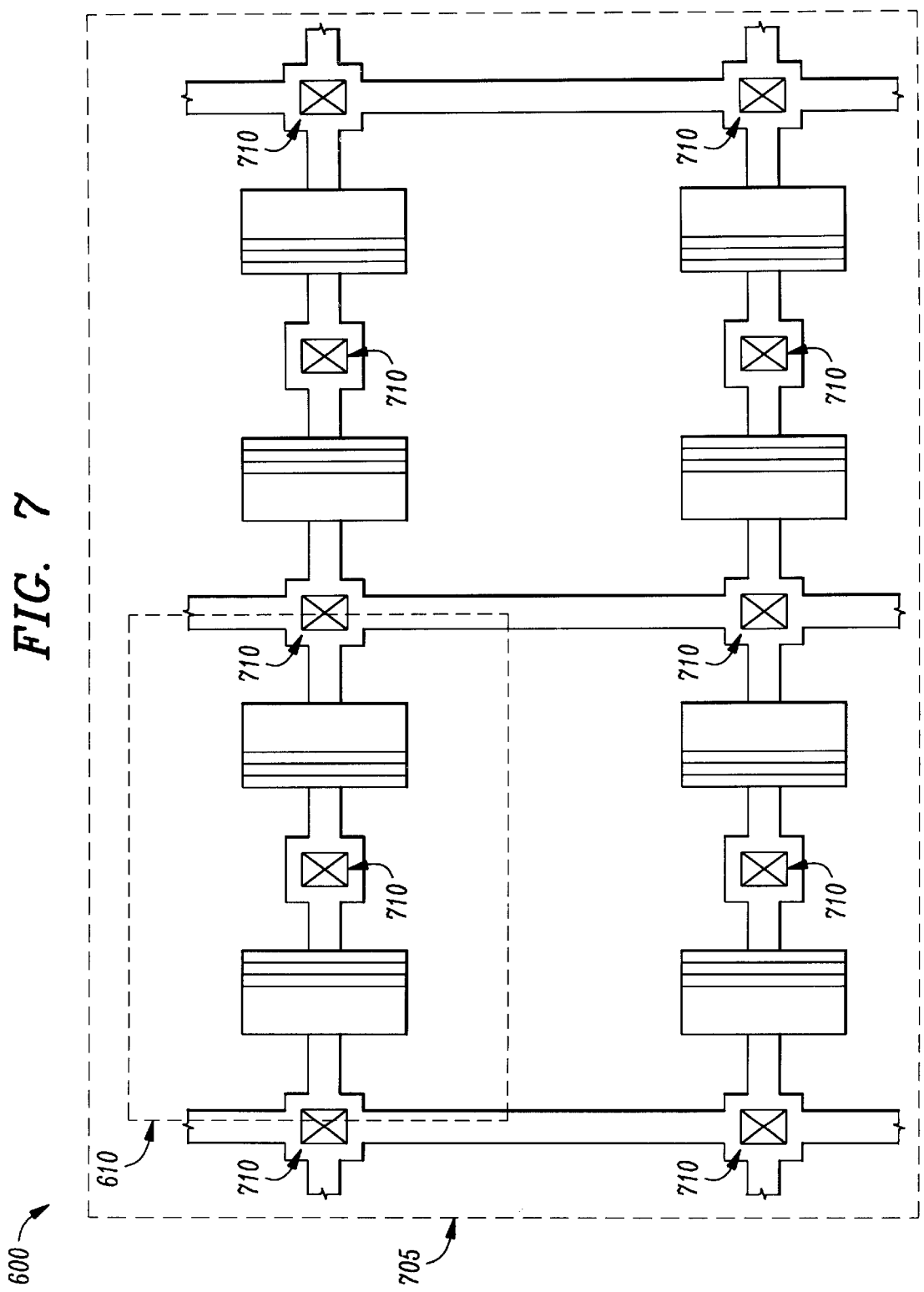
FIG. 7 illustrates a plan view of a memory array of the semiconductor device illustrated in FIG. 6.

FIG. 7 illustrates a plan view of a memory array 705 of the semiconductor device 100, including, the flash memory device 610 with the bipolar transistor incorporated therein. The memory array 705 includes reading contact points 710 so that the memory array 705 can be flashed.

FIGS. 8–12 illustrate an alternative embodiment of the present invention. Referring initially to FIG. 8, there is illustrated a partial sectional view of the semiconductor device 800 at an intermediate step of fabrication. It should be noted that the semiconductor device 800 is identical to the structure illustrated in FIGS. 1 and 2; however, the n-type lightly doped drain (NLDD) implanting step that forms the bipolar transistor base 210, the source 215 and the drain 220 of the MOS tub 170 are conducted in a different manner. In this particular embodiment, the flash memory gate 125 and the MOS tub 175 are protected by photoresist 810 while the MOS tub 170 and a base region 815 are exposed to an (NLDD) implanting step indicated by the arrows. As with the embodiments discussed with respect to FIGS. 1–6, the implanting step may be conducted with the same mask or one additional mask. In the embodiment illustrated in FIG. 8, the implanting step is conducted with the same mask. The implantation step forms the base region 815 and the source and drain 215,220, both of which are lightly doped to a concentration that ranges from about $5\times10^{13}$ atoms/cm$^3$ to about $8\times10^{14}$ atoms/cm$^3$. The base region 815, therefore includes a lightly doped wide portion 815a and a lightly doped narrow portion 815b. The wide portion 815a preferably has a width that is substantially wider than the narrow portion 815b. A relative exemplary substantially wider width of the portion 815a is shown in FIG. 8.

FIG. 9 shows the process of forming the source 310 and the drain 315 within the MOS tub 175. To accomplish this, a photoresist 910 is conventionally deposited and patterned to leave the area over the MOS tub 175 exposed, while the memory cell region 105 and the MOS tub 170 remain protected by the photoresist 910. The semiconductor device 800 is then preferably subjected to a conventional p-type lightly doping drain implant (PLDD), thus forming the source and drain 310, 315 within the MOS tub 175. The photoresist 910 is then removed in preparation for the next fabrication step.

Turning now to FIG. 10, after removal of the photoresist, oxide spacers 825 are conventionally formed on the sides of the flash memory gate 125 and the MOS transistor gates 830, 835. Another photoresist 840 is deposited and patterned to expose a portion of the base region 815 and the MOS tub 170, while leaving the MOS tub 175 protected by the photoresist 840. An n-type source drain (N S/D) implantation of the portion of the base region 815 and the MOS tub 170 is then conducted such that only the base region 815 and source and drain 215,220, encounter the N S/D implantation. This N S/D implantation forms a heavily doped region 815c within the more lightly doped wide portions 815a and lightly doped portion 815b. The heavily doped region 815c is preferably doped to a concentration level that ranges from about $5\times10^{14}$ atoms/cm$^3$ to about $5\times10^{15}$ atoms/cm$^3$. The heavily doped region 815c has a much lower sheet resistance, which allows a signal to travel much faster, thereby providing faster read times for the memory device.

In a preferred embodiment, the heavily doped region 815c that is formed in the lightly doped wide portion 815a has a width that is less than the width of the lightly doped wide portion 815a. The difference in the width should be sufficient to allow space for the formation of an emitter within the lightly doped wide portion 815a.

Figure 12:
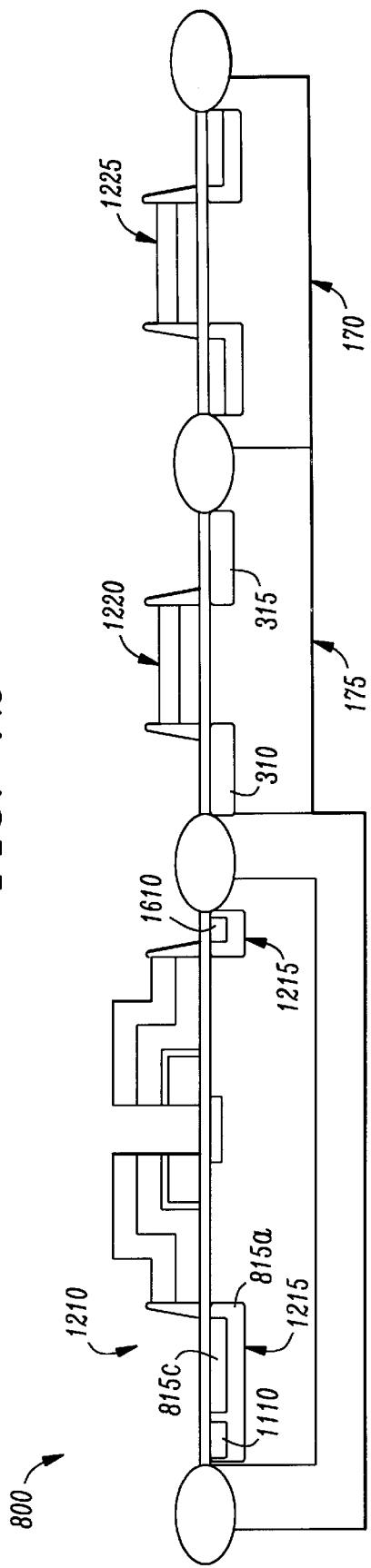
FIG. 12 illustrates a completed flash memory device with a bipolar transistor incorporated therein, both of which are formed adjacent CMOS transistors, as described in FIGS. 8–11.

Turning now to FIG. 11 there is illustrated a partial sectional view in which a bipolar transistor emitter 1110 is formed within the lightly doped wide portion 815a and simultaneously with a second source drain implant of the source and drain 310, 315 of the MOS tub 175. In the illustrated embodiment, a photoresist 1120 is deposited and patterned to leave a portion of the lightly doped wide portion 815a and the MOS tub 175 exposed to a doping process. These exposed areas are then subjected to a p-type source drain implant (P S/D), which simultaneously forms the bipolar transistor emitter 1110 and further dopes the source and drain 310, 315. As shown in this particular embodiment, the bipolar transistor emitter 1110 is formed adjacent to the heavily doped region 815c, as illustrated. FIG. 12 illustrates a completed flash memory device 1210 with a bipolar transistor 1215 incorporated therein, both of which are formed adjacent CMOS transistors 1220, 1225 as described in FIGS. 8–11.

Figure 13:
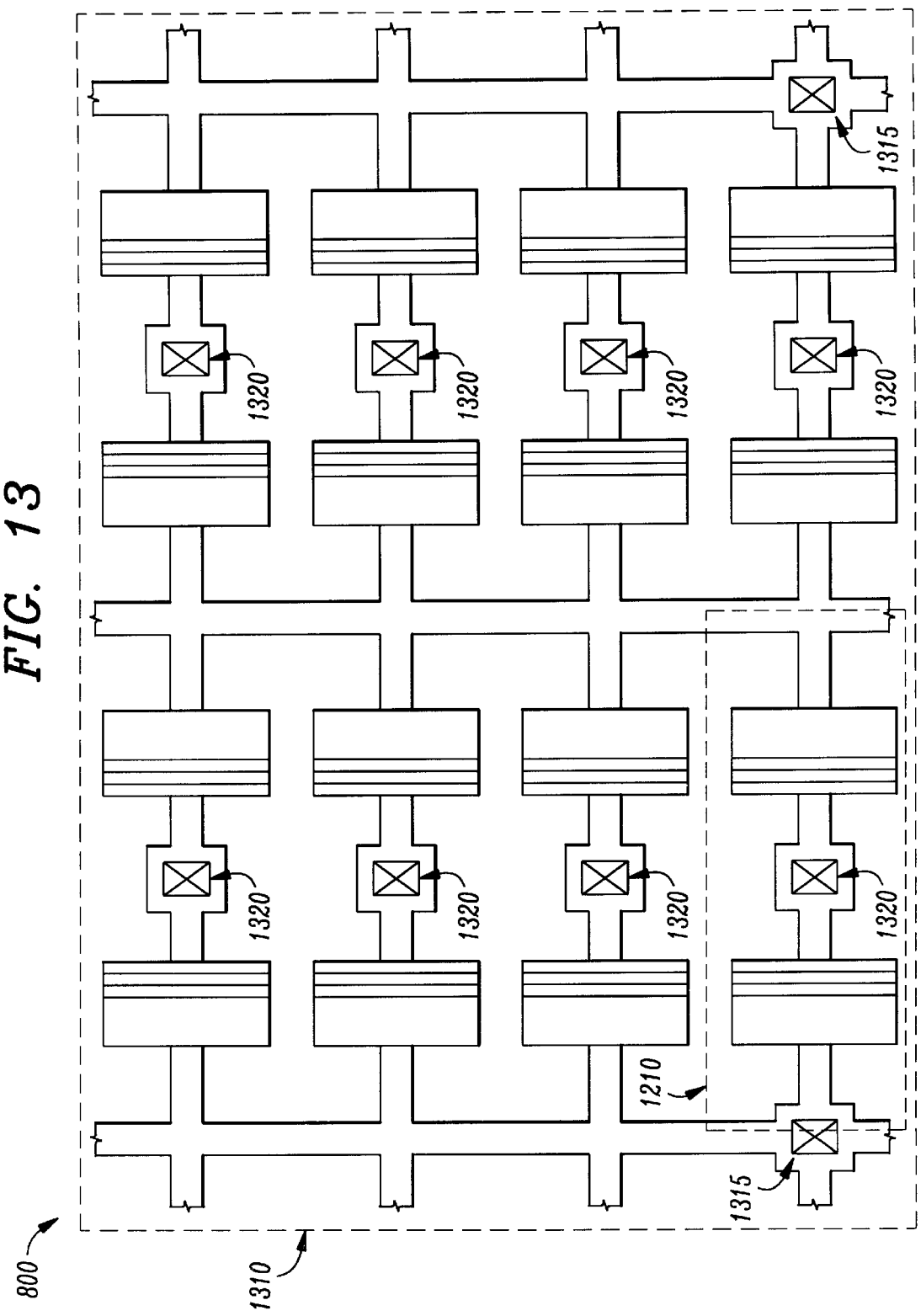
FIG. 13 illustrates a plan view of a memory array of the semiconductor devices as described in FIGS. 8–12.

Illustrated in FIG. 13 is a plan view of a memory array 1310 of the semiconductor device 800 as described in FIG. 12, including the flash memory device 1210 with the bipolar transistor incorporated therein, as discussed above with respect to FIGS. 8–12. The memory array 1310 includes reading contact points 1315 and interconnects 1320 that connect flash memory devices 1210 to other levels within the semiconductor device 800.

The semiconductor device 800 illustrated in FIG. 12 provides the same benefits of faster read times as the semiconductor device illustrated in FIG. 6; however, the semiconductor device 800 illustrated in FIG. 12 saves space and money, because not as many interconnects are needed.

Although the present invention has been described in detail, those skilled in the art should understand that they can make various changes, substitutions and alterations herein without departing from the spirit and scope of the invention in its broadest form.

What is claimed is:

1. For use in increasing a speed of a flash memory cell having a source region and a drain region and first and second complementary tubs, a bipolar transistor, comprising:
   a base region located in the first complementary tub, the base region including;
      a lightly doped portion doped with a base dopant; and
      a heavily doped portion doped with the base dopant and located within the lightly doped portion, the heavily doped portion also functioning as the source region; and
   an emitter located in the lightly doped portion and located adjacent the heavily doped portion, the first complementary tub functioning as a collector for the bipolar transistor.

2. The bipolar transistor as recited in claim 1 wherein the emitter is doped with an emitter dopant opposite in type to the base dopant.

3. The bipolar transistor as recited in claim 1 wherein the base dopant is an n-type dopant having a concentration in the heavily doped portion that ranges from about $5\times10^{14}$ atoms/cm$^3$ to about $5\times10^{15}$ atoms/cm$^3$.

4. The bipolar transistor as recited in claim 2 wherein the flash memory cell is part of a flash memory array, the first and second complementary tubs and the base region spanning the memory array.

5. The bipolar transistor as recited in claim 4 further comprising at least one reading contact point in electrical contact with the emitter for flashing the memory array.

6. The bipolar transistor as recited in claim 1 wherein the flash memory cell is part of a flash memory array and the bipolar transistor further comprises multiple reading contact points for flashing the memory array.

7. The bipolar transistor as recited in claim 1 wherein the first complementary tub is a P tub and the second complementary tub is an N tub.

8. The bipolar transistor as recited in claim 2 wherein the base comprises an n-type dopant and the emitter comprises a p-type dopant.

9. The bipolar transistor as recited in claim 1 further including opposing bases and emitters located on opposing sides of and proximate to the flash memory cell.

10. A semiconductor device, comprising:
    a flash memory cell having a source region and a drain region and first and second complementary tubs;
    an integrated circuit electrically connected to the flash memory cell; and
    a bipolar transistor, including:
       a base region located in the first complementary tub, the base region including;
          a lightly doped portion doped with a base dopant; and
          a heavily doped portion doped with the base dopant and located within the lightly doped portion, the heavily doped portion also functioning as the source region; and
       an emitter located in the lightly doped portion and located adjacent the heavily doped portion, the first complementary tub functioning as a collector for the bipolar transistor.

11. The semiconductor device as recited in claim 10 wherein the emitter is doped with an emitter dopant opposite in type to the base dopant.

12. The bipolar transistor as recited in claim 10 wherein the base dopant is an n-type dopant having a concentration in the heavily doped portion that ranges from about $5\times10^{14}$ atoms/cm$^3$ to about $5\times10^{15}$ atoms/cm$^3$.

13. The semiconductor device as recited in claim 11 wherein the flash memory cell is part of a flash memory array, the first and second complementary tubs, and the base region spanning the memory array.

14. The semiconductor device as recited in claim 13 further comprising at least one reading contact point in electrical contact with the emitter for flashing the memory array.

15. The semiconductor device as recited in claim 10 wherein the flash memory cell is part of a flash memory array and the bipolar transistor further comprises multiple reading contact points for flashing the memory array.

16. The semiconductor device as recited in claim 10 wherein the first complementary tub is a P tub and the second complementary tub is an N tub.

17. The semiconductor device as recited in claim 16 wherein the base comprises an n-type dopant and the emitter comprises a p-type dopant.

18. The semiconductor device as recited in claim 10 further including opposing bases and emitters located on opposing sides of and proximate to the flash memory cell.

19. The semiconductor device as recited in claim 10 wherein the flash memory cell is a split gate flash memory cell.

20. The semiconductor device as recited in claim 10 wherein the integrated circuit is a complementary metal oxide semiconductor (CMOS) integrated circuit.

* * * * *